United States Patent [19]

Mendel

[11] Patent Number: 5,341,308
[45] Date of Patent: Aug. 23, 1994

[54] METHODS FOR ALLOCATING CIRCUIT ELEMENTS BETWEEN CIRCUIT GROUPS

[75] Inventor: David W. Mendel, Menlo Park, Calif.

[73] Assignee: Altera Corporation, San Jose, Calif.

[21] Appl. No.: 702,001

[22] Filed: May 17, 1991

[51] Int. Cl.$^5$ ............................................. G06F 15/60
[52] U.S. Cl. ..................... 364/489; 364/488
[58] Field of Search ............... 364/488, 489, 490, 491

[56] References Cited

U.S. PATENT DOCUMENTS

| | | | |
|---|---|---|---|
| 3,617,714 | 11/1971 | Kernighan et al. | 235/150 |
| 4,577,276 | 3/1986 | Dunlop et al. | 364/491 |
| 4,908,772 | 3/1990 | Chi | 364/491 |
| 4,918,614 | 4/1990 | Modarres et al. | 364/490 |
| 5,113,352 | 5/1992 | Finnerty | 364/490 |
| 5,187,784 | 2/1993 | Rowson | 364/491 |

OTHER PUBLICATIONS

"A Class of Min-Cut Placement Algorithms" by M. A. Breuer et al.

B. W. Kernighan and S. Lin, "An Efficient Heuristic Procedure for Partitioning Graphs", The Bell System Technical Journal, Feb. 1970, pp. 291-307.

D. G. Schweikert and B. W. Kernighan, "A Proper Model for the Partitioning of Electrical Circuits", Proceedings of the 9th Design Automation Workshop, 1979, pp. 57-62.

C. M. Fiduccia and R. M. Mattheyses, "A Linear-Time Heuristic for Improving Network Partitions", 19th Design Automation Conference, 1982, pp. 241-247.

B. Krishnamurthy, "An Improved Min-Cut Algorithm for Partitioning VLSI Networks", IEEE Transactions on Computers, vol. C-33, No. 5, May 1984, pp. 438-446.

*Primary Examiner*—Vincent N. Trans
*Attorney, Agent, or Firm*—Robert R. Jackson

[57] ABSTRACT

Circuit partitioning methods are enhanced by more accurately accounting for circuit nets which include connections external to the circuit being partitioned. The user can also prohibit movement of any circuit element or cell which the user does not want to have moved. The user can also prevent splitting of any net or set of cells which the user does not want to have split. The balance requirement of prior art methods is modified to allow circuit element moves which imbalance the partition. However, balance is ultimately restored by further circuit element moves.

7 Claims, 8 Drawing Sheets

| LINE NO. | SYMBOL | MEANING |
|---|---|---|
| 1 | \|\| | OR |
| 2 | && | AND |
| 3 | == | EQUALITY TEST |
| 4 | $\Gamma_k(C)$ | GAIN VECTOR FOR $C = [\delta_1(C), \delta_2(C), \ldots \delta_k(C)]$ (FROM REFERENCE (4)) |
| 5 | $\delta_i(C)$ | GAIN VECTOR ELEMENT i FOR CELL C (FROM REFERENCE (4)) |
| 6 | $\beta_X(N)$ | BINDING OF NET N TO X |
| 7 | $a, B$ | TWO HALVES OF THE PARTITION |
| 8 | $C$ | EVERYTHING NOT IN $a$ OR $B$ |
| 9 | $a_L, B_L$ | SETS REPRESENTING LOCKED CELLS IN $a$ AND $B$, RESPECTIVELY |
| 10 | $a_F, B_F$ | SETS REPRESENTING FREE CELLS IN $a$ AND $B$, RESPECTIVELY |
| 11 | \|\|...\|\| | THE NUMBER OF ELEMENTS IN SET... |
| 12 | $\Sigma$ | SUMMATION |

*FIG. 1*

| LINE NO. | RELATIONSHIP |
|---|---|
| 1 | $\delta_i(C) = \|\{N \in \pi_C \mid \beta_\alpha(N) = i\}\| - \|\{N \in \pi_C \mid \beta_\beta(N) = i-1\}\|$ |
| 2 | $\delta_i(C) = \sum_{N \in \pi_C} f(N, \alpha, i) - \sum_{N \in \pi_C} f(N, \beta, i-1)$<br>WHERE $f(N, X, i) = 1$ IF $\beta_X(N) = i$<br>$= 0$ IF $\beta_X(N) \neq i$ |
| 3 | $f(N, X, i) = 2$ IF $\beta_X(N) = i$ AND N NOT ON C<br>$1$ IF $\beta_X(N) = i$ AND N IS ON C<br>$0$ IF $\beta_X(N) \neq i$ |

FIG. 2

METHODS FOR ALLOCATING CIRCUIT ELEMENTS BETWEEN CIRCUIT GROUPS

BACKGROUND OF THE INVENTION

This invention relates to the design of circuits with complex interconnections between circuit elements, and more particularly to methods for allocating interconnected circuit elements between two or more circuit element groups so that the number of interconnections required between the groups is minimized or at least substantially reduced.

In the design of large circuits, such as very large scale integrated ("VLSI") logic circuits, it is frequently necessary to subdivide the circuitry so that it can be implemented in two or more relatively discrete parts of one device or in two or more discrete devices. The circuit elements must be allocated between these two or more groups so that the number of interconnections required between the groups is not excessive. Indeed, it is usually desirable to find the allocation of circuit elements which reduces the number of required interconnections between the groups as much as possible. This problem, known as partitioning, has been extensively considered in the literature. See, for example, (1) B. W. Kernighan and S. Lin, "An Efficient Heuristic Procedure for Partitioning Graphs", The Bell System Technical Journal, February 1970, pp. 291-307 (see also U.S. Pat. No. 3,617,714); (2) D. G. Schweikert and B. W. Kernighan, "A Proper Model for the Partitioning of Electrical Circuits", Proceedings of the 9th Design Automation Workshop, 1979, pp. 57-62; (3) C. M. Fiduccia and R. M. Mattheyses, "A Linear-Time Heuristic for Improving Network Partitions", 19th Design Automation Conference, 1982, pp. 241-47; and (4) B. Krishnamurthy, "An Improved Min-Cut Algorithm for Partitioning VLSI Networks", IEEE Transactions on Computers, Vol. C-33, No. 5, May 1984, pp. 438-46, all of which are hereby incorporated by reference herein. Partitioning methods of the general type employed in the present invention are believed to have originated with reference (1) above, and to have progressed through additional enhancements in order with references (2), (3), and (4). The present invention comprises further modifications and improvements to the techniques shown and described in reference (4).

As noted above, the goal of a partitioning method is to partition or divide a set of circuit elements or "cells" connected by wires into two or more circuit element groups such that the number of wires which cross from one group to the other is minimized or at least substantially reduced. A circuit element group, as that term is employed herein, may be a discrete device such as an integrated circuit or a printed circuit board, or it may be a relatively discrete part of a larger device. For example, the two or more circuit element groups mentioned above may be two or more relatively discrete parts of a single integrated circuit such as a programmable logic array device. In the literature a set of cells connected by a common wire is generally referred to as a net. In at least the later references identified above (e.g., references (2)-(4)), a net can include any number of cells. Partitioning involves moving cells from one circuit element group to the other in an effort to reduce the number of connections required between the resulting circuit element groups. The prior art (and the present invention) provides methods for allowing various solutions to the partitioning problem to be tried in a systematic way in order to more rapidly and efficiently find the circuit element moves which give the best result.

In the above-mentioned prior art, it is generally assumed that dividing the cells of a net between two circuit element groups requires the use of two terminals or pins: one for the output from one circuit element group, and one for the input to the other circuit element group. Conversely, it is assumed that placing all the cells of net in one circuit element group allows the elimination of the two pins just described. This assumption is not always correct. For example, if a signal is an input to multiple cells which comes from outside the circuit (e.g., an external clock signal) or from a circuit element group other than the two groups currently being partitioned (where the circuit includes more than two circuit element groups), one pin is still required to apply the signal to the circuit element groups being partitioned even through all of the cells receiving that signal are in one of the circuit element groups being partitioned. When such cells are found in both circuit element groups being partitioned, two pins are required. Similarly, if a net signal is required as an output to the circuit or for application to a circuit element group other than the two currently being partitioned, one pin is again required to provide this output. When the cells of this net are split between the two circuit element groups being partitioned, two pins are required. In both of the examples mentioned above, the penalty for splitting the net is less than is assumed in the prior art such as reference (4), and conversely the benefit derived from not splitting the net is less than is assumed in the prior art such as reference (4). It would therefore be desirable to provide partitioning methods which more accurately take into account the effect of splitting nets which include connections external to the circuitry being partitioned.

The prior art such as reference (4) assumes that any cell is a candidate for movement from one circuit element group to another. However, the user of the method may know that certain cells should not be moved from the circuit group in which they have been placed initially (e.g., because those cells require some circuit resource which is unique to that circuit element group). It would therefore be desirable to provide partitioning methods which prevent certain cells from being moved.

The prior art such as reference (4) assumes that any net (or more generally, any collection or set of cells whether or not connected to one another in a net) can be split. The user of the method may know, however, that certain nets (or even unconnected sets of cells) should not be split (e.g., because splitting them would obviously result in inefficient use of some circuit resource). It would therefore be desirable to provide partitioning methods which prevent certain nets or sets of cells from being split.

The prior art such as reference (4) requires that a predetermined balance between the circuit element groups be preserved whenever a cell is moved from one group to the other. A cell is not allowed to move if the result will be that this balance requirement is violated. If the available circuit resources are at or close to full utilization, many possibly good moves may be precluded by this balance constraint, even though balance could be restored by subsequent moves. It would therefore be desirable to provide partitioning methods which do not require that balance between the circuit element groups be maintained with every move, but which ultimately do produce partitions which have the required balance.

In view of the foregoing, it is an object of this invention to provide improved circuit partitioning methods.

It is a more particular object of the invention to provide circuit partitioning methods which more accurately account for the effect of splitting or combining nets which utilize or are required to provide signals external to the circuit or the circuit element groups currently being partitioned.

It is another more particular object of the invention to provide circuit partitioning methods which allow the user to prevent certain cells from being moved and/or certain nets or sets of cells from being split.

It is still another more particular object of the invention to provide circuit partitioning methods which allow cells to be moved even though a specified balance between the circuit element groups is violated, said balance being restored by subsequent cell moves.

SUMMARY OF THE INVENTION

These and other objects of the invention are accomplished by modifying circuit partitioning methods of the type shown and described in reference (4) above in one or more of the following respects.

Instead of using the gain vector of reference (4) to represent the number of nets that would be cut by moving each cell from one circuit element group to another, the gain vector is modified so that it represents the number of additional pins that will be required by such a move. This allows finer gradation of the gain vector values, and in particular allows the gain vector to accurately represent nets which include a connection external to the circuitry currently being partitioned and which therefore still require one pin even when the net is not split between the two circuit element groups being partitioned.

In any given trial partitioning pass, reference (4) "locks" a cell once it has been moved. The methods of this invention allow the user to similarly lock any cell in its initial circuit element group if desired so that that cell will never be moved from that group.

In order to reduce the number of cells that the reference (4) partitioning methods must separately consider and handle, the methods of this invention allow cells to be lumped together to create a new master cell having a weight equal to the sum of the cells making up the master cell. Thereafter the master cell is treated like any other unitary cell (e.g., it is moved as a unit and never subdivided).

In order to allow cell moves which may temporarily disturb the desired balance between the two circuit element groups, the methods of reference (4) are modified to permit such moves and to thereafter choose subsequent moves based in part on attempting to restore the desired balance.

Further features, of the invention, its nature and various advantages will be more apparent from the accompanying drawings and the following detailed description of the preferred embodiments.

BRIEF DESCRIPTION OF THE DRAWINGS

FIG. 1 is a diagram explaining the meanings of several symbols used elsewhere in the specification and drawings.

FIG. 2 shows several relationships which are useful in explaining one aspect of the invention.

DETAILED DESCRIPTION OF THE PREFERRED EMBODIMENTS

Figure 3A:
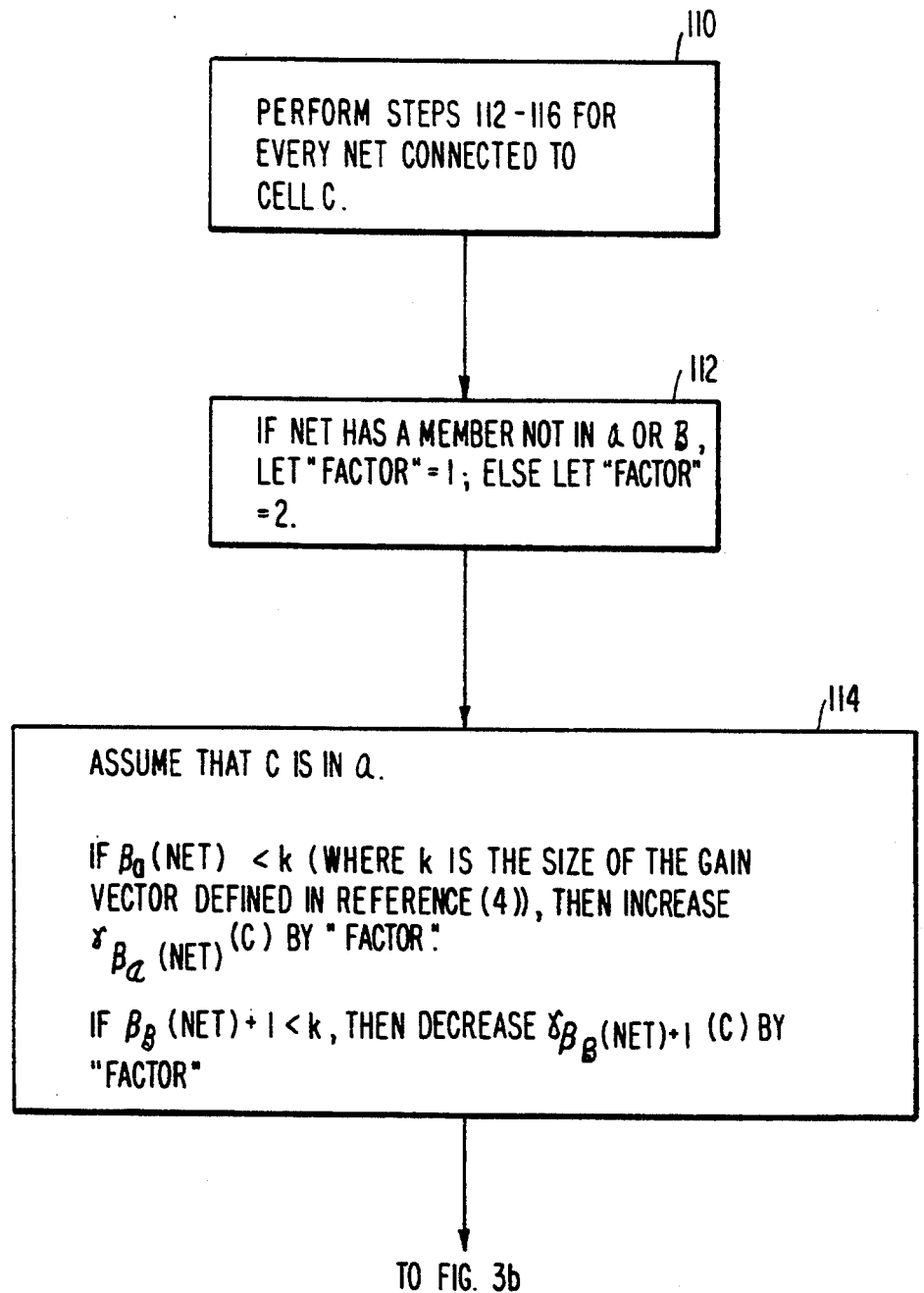
FIGS. 3a and 3b (hereinafter referred to collectively as FIG. 3) is a flow chart of an illustrative embodiment of a first aspect of the invention.

Although the improvements of this invention can be implemented in other contexts, in the presently preferred embodiment they are implemented by modifying portions of the methods shown and described in reference (4) above. Because reference (4) is thorough, complete, and detailed, and because the modifications made in accordance with this invention are relatively few in number and confined to a few portions of what is shown in reference (4), it will not be necessary to repeat the substance of reference (4) beyond what has been said above. Instead, only the modifications to what is shown and described in reference (4) in accordance with this invention are discussed below. (An omission from reference (4) is the definition of OP10. This omission is supplied here as follows: OP10: Given a partition, examine/modify the cut size.)

Preliminarily it should be noted that whereas the following detailed discussion refers for the most part to partitioning a circuit between two circuit element groups, the methods of this invention can be employed in partitioning a circuit into a larger number of groups. As in the prior art, only two groups are considered at any one time, but the method is repeated for each pair of circuit groups one after another. Thus if there were four circuit groups (numbered 1-4), the method would be performed successively for the following pairs of groups: 1,2; 1,3; 1,4; 2,3; 2,4; and 3,4. When partitioning between any two groups, cells in the other groups are considered to be outside or external to the circuit being partitioned. This is especially important to the feature of the present invention (described in detail below) which deals with how connections to external circuitry are handled. In particular, in that feature, any connection to a cell not in the two circuit groups currently being partitioned is treated in accordance with this invention like an external connection.

A. More Accurate Treatment of External Connections

Connections external to the circuitry being partitioned are treated more accurately in accordance with the present invention by modifying the gain vector defined on page 440 of reference (4). FIG. 1 shows symbols used in subsequent FIGS., some of which are somewhat different from those used in reference (4). (The FIGS. are used for this material because some of it is too typographically complex to include in this written specification.) In summary, this feature of the present invention involves redefining the gain vector elements (FIG. 1, line 5) originally defined on page 439 of reference (4), and using this new definition in calculating the gain vector (FIG. 1, line 4) in step 4 of algorithm 2 of reference (4) and in step 3e of algorithm 3 of reference (4).

Reference (4) defines the variable shown in line 5 of FIG. 1 on page 439. A more accurate definition of that variable is shown in line 1 of FIG. 2. In order to explain the present invention, it is convenient to rewrite this relationship as shown in line 2 of FIG. 2. In accordance with the present invention the functions employed in line 2 of FIG. 2 are modified as shown in line 3 of FIG. 2. As shown at line 8 of FIG. 1, the script C is used in line 3 of FIG. 2 to represent the location of any cell not in script A or script B. All input pins and output pins are assumed to be fed by or to feed an imaginary cell in script C. Thus if a net N does not extend to script C, the contribution of that net to the gain vector may be 2 or 0 depending on the other characteristics of the circuit being partitioned. The value 2 is twice the value used under similar circumstances in reference (4) (see line 2 of FIG. 2). On the other hand, if net N does extend to script C, the contribution of that net to the gain vector may be 1 or 0, again depending on other characteristics of the circuit being partitioned. The gain vector contribution due to a connection external to script A and B is therefore one-half the gain vector contribution due to a connection internal to script A and B. Viewed another way the gain vector contributions used in reference (4) are inflated (i.e., doubled from 1 to 2) so that a lesser value (i.e., 1) can be inserted in the scale to more accurately account for connections external to the circuitry currently being partitioned. As has been noted above, all truly external connections are assumed to be to script C, and when the circuit is being partitioned into more than two circuit element groups, all connections to cells not in the two groups (script A and B) currently being partitioned are treated as connections to script C.

Figure 3B:
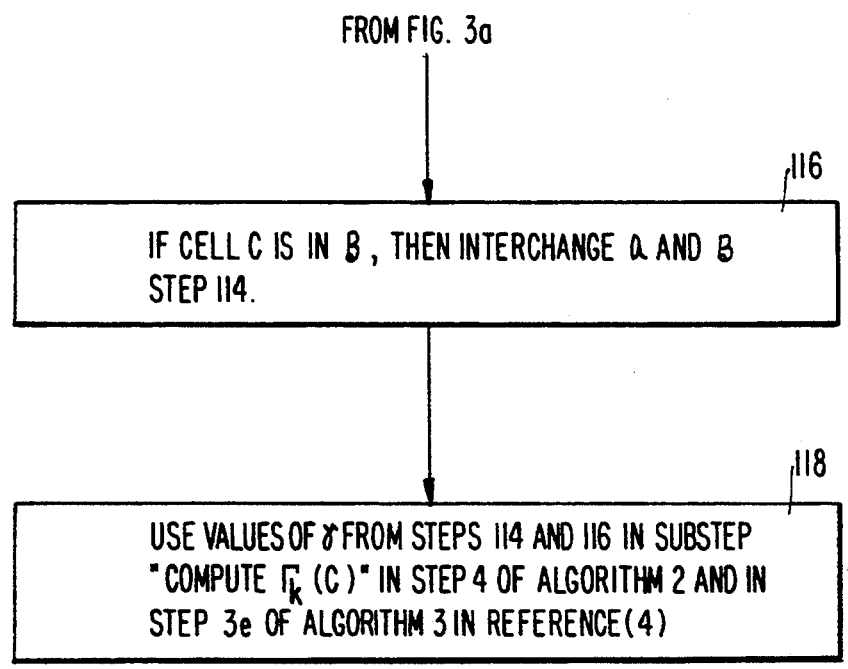

FIG. 3 is a flow chart of steps which can be carried out in accordance with this invention to implement the foregoing as a modification of the methods of reference (4). The steps shown in FIG. 3 are self-explanatory in view of the preceding discussion. As can be seen in step 112, the "factor" which is used in steps 114 and 116 to compute the gain vector elements is either 1 if the net under consideration has a connection external to the circuit element groups currently being partitioned, or 2 if there is no such external connection. Then when the gain vector is computed in step 118, that vector automatically and correctly accounts for both connections internal to the circuit element groups currently being partitioned and connections external to those circuit element groups. In particular, as is explained in the background section of this specification, the number of pins required for interconnecting two circuit element groups is reduced by two when the last cell of a net is moved to the group containing all other cells of that net. Conversely, the number of pins increases by two when the first cell of a net is moved out of a circuit element group containing all of the other cells of that net. Hence the use of the "factor" value 2 in connection with such nets in accordance with this invention. But if a net has a connection external to the two circuit element groups currently being partitioned, the "factor" used in accordance with this invention is 1 to reflect the fact that a pin is still required (for the external connection) even if all cells of the net are in one circuit element group. Partitioning such a net between script A and script B only increases the pin count by one. And conversely, eliminating the partitioning of such a net only decreases the pin count by one. The modified gain vector values employed in accordance with this invention therefore automatically reflect the true cost of partitioning a net whether or not it is one with an external connection.

B. Preventing Predetermined Cells from Moving

Figure 4:
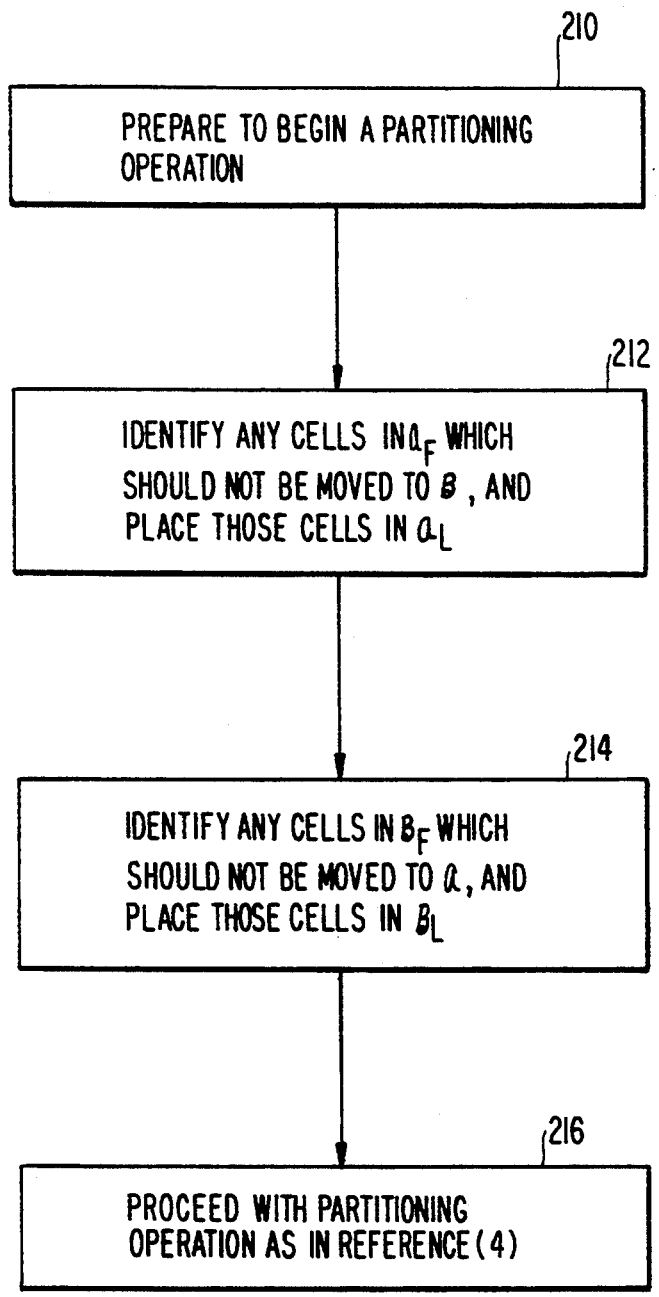
FIG. 4 is a flow chart of an illustrative embodiment of a second aspect of the invention.

Normally all cells are initially put in the free cell sets represented by the symbols in line 10 of FIG. 1. As is explained in reference (4), when a cell is moved from one of these free cell sets to the other circuit element group, it is put in the locked cell set (line 9 of FIG. 1) in that other circuit element group. Once a cell has been locked in this manner, it is precluded from further movement. In accordance with the present invention, the user may preliminarily place any cell in the locked cell set in the circuit element group in which that cell is found if the user knows that that cell should not be moved to the other circuit element group. Illustrative method steps for accomplishing this are shown in FIG. 4.

In step 210 conventional preparation to begin a partitioning operation is made. In step 212 the user identifies any cell in the first circuit element group (script A) which should not be moved to the other circuit element group (script B) during the partitioning operation. All such cells are placed in the locked cell set in the first circuit element group. In step 214, the user performs a similar operation with respect to any cell in the second circuit element group which should not be moved to the first circuit element group, and all such cells are placed in the locked cell set in the second circuit element group. The partitioning operation can then proceed with step 216 as in reference (4). During the performance of step 216 none of the cells placed in the locked cell sets in steps 212 and 214 will be moved. The inclusion and performance of steps 212 and 214 therefore allows the user to prevent any cell or cells from being moved during the partitioning operation.

C. Preventing a Predetermined Group of Cells from Being Split

Figure 5:
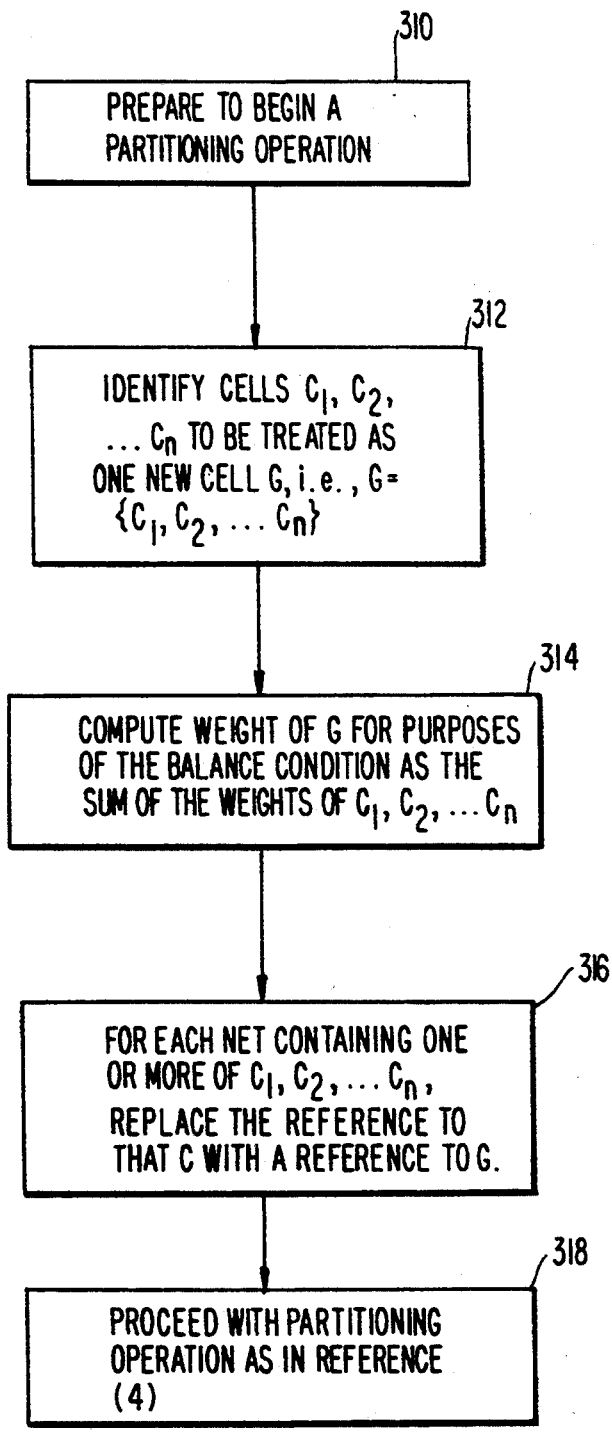
FIG. 5 is a flow chart of an illustrative embodiment of a third aspect of the invention.

If the user knows that a certain group of cells should not be split, the methods of this invention allow the user to group those cells into a new master cell which is thereafter treated as a unit. This prevents the cells in that master cell from being split by any partitioning of the circuit. The new master cell is either left in its initial circuit element group, or it is moved as a whole to the other circuit element group. But it can never be subdivided or split. Illustrative steps for providing this feature of the invention are shown in FIG. 5.

In step 310 conventional preparation to begin a partitioning operation is made. In step 312 the user identifies the cells in either circuit element group which are not to be split and which are therefore to be treated collectively as one new master cell G. In step 314 the weight of master cell G for purposes of the balance condition (discussed in more detail in the next section of this specification) is computed as the sum of the weights of the cells which make up master cell G. In step 316, for each net containing a reference to a cell which is a constituent of master cell G, the reference to the constituent cell is replaced by a reference to G. If a net includes more than one constituent of G, G should appear only once on that net. For example, if a particular net={cell3, cell5, cell7, cell8} and G={cell3, cell5, cell9}, then this net is rewritten as net={G, cell7, cell8}. Note that G appears only once in the rewritten list for this net even though two of its members are part of the net. In step 318 the partitioning operation proceeds conventionally as in reference (4). Because of the performance of steps 312–316, G replaces its constituents in the partitioning operation. G is never split because G is now like any other cell, and cells are the smallest unit of circuitry considered by partitioning methods.

D. Allowing Cells to Move Even Though The Balance Condition May be Temporarily Violated Algorithm 4 of reference (4) is modified as will now be discussed in order to allow cells to move even though the specified balance between circuit element groups may not be temporarily achieved. By way of background it should be noted that the balance referred to may be a balance of any circuit resource such as physical area on an integrated circuit, number of prefabricated but programmable modules on such a circuit, or any other resource which may constrain the number, size, and/or kind of cells or circuit elements which can be included in either circuit element group. (An exception to the foregoing is what may be referred to as the pin resource. The method attempts to minimize the number of pins required, subject to the constraints imposed by the balance condition. Once the number of pins is legal as well, a successful partition has been generated). In addition, whereas the relatively simple term balance is employed herein, it will be understood that there is often a range of acceptable apportionments of circuit elements between the two circuit element groups (although the present aspect of the invention becomes increasingly important and useful as this range becomes smaller (e.g., because the overall circuit resources available are fully or almost fully utilized by the circuit being partitioned) or because the balance range is small in comparison to the resources required by typical cells). Accordingly, in the appended claims the balance requirement discussed here is referred to as division of an overall circuit resource in accordance with a predetermined ratio range. But this is just a more general term for "balance" as that word is used elsewhere herein and in reference (4).

Figure 6A:
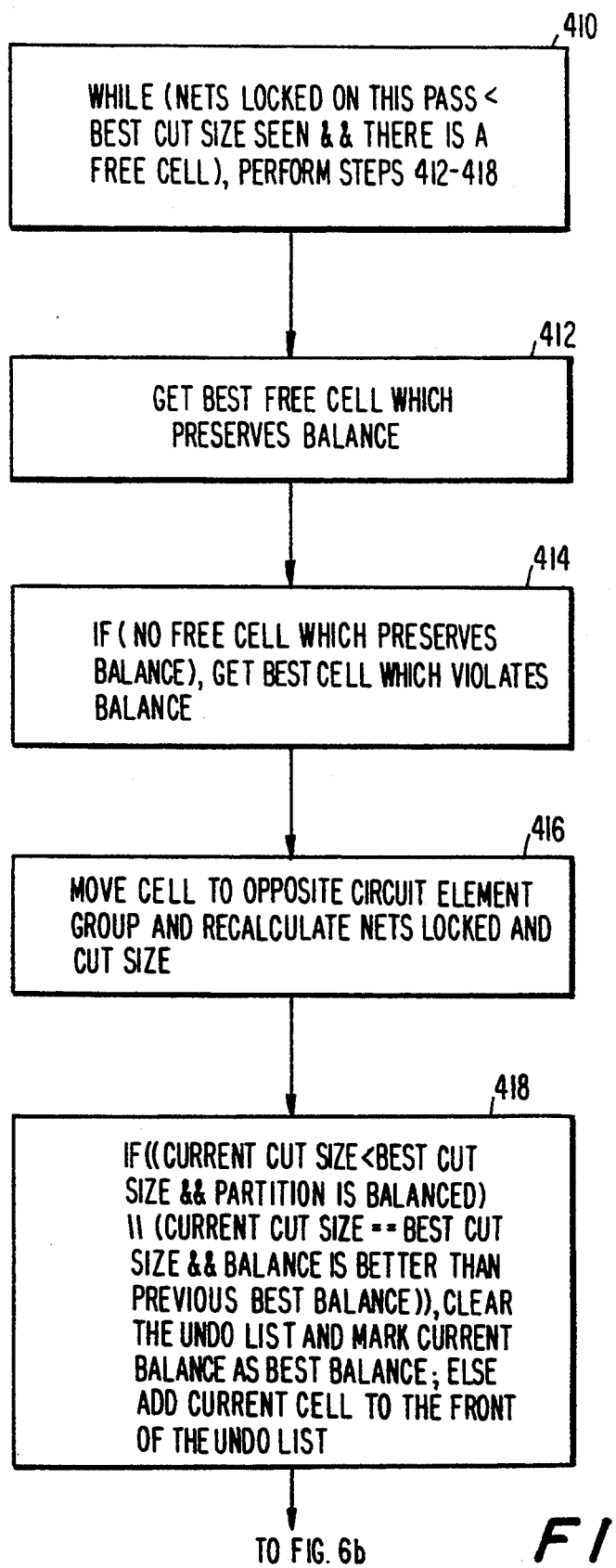
FIGS. 6a and 6b (hereinafter referred to collectively as FIG. 6) is a flow chart showing how a portion of an algorithm in reference (4) can be modified to implement a fourth aspect of the invention.
Figure 6B:
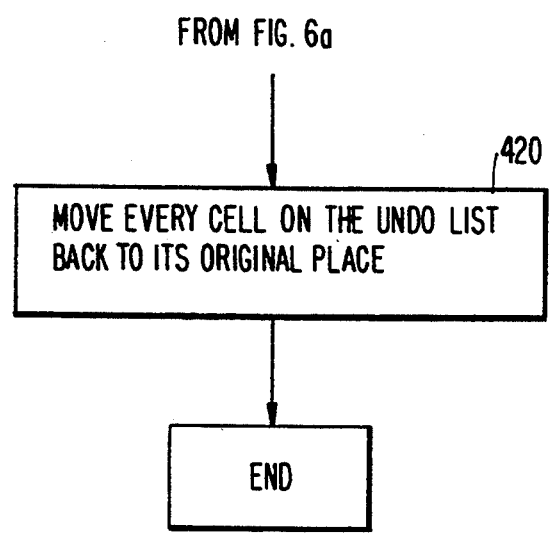

The portion of algorithm 4 from reference (4) which is modified in accordance with this aspect of the invention begins with step 2 and is shown in FIG. 6. As shown in FIG. 1 the symbol && means that both conditions must be true, the symbol || means that either condition must be true, and the symbol == represents equality. Step 410 in FIG. 6 is like step 2 in algorithm 4 of reference (4) except that preservation of balance is not required in step 410.

In step 412 the best free cell which can be moved while preserving the balance is identified in a manner similar to step 2a in algorithm 4 of reference (4). However, if there is no free cell which can be moved without violating the balance, then step 414 is performed to identify the best free cell which can be moved even though the balance will thus be violated.

In step 416 the cell identified in step 412 or 414 is moved as in step 2b of algorithm 4 in reference (4).

In step 418 if either of two tests is satisfied, then the undo list ($\sigma$ in reference (4)) is cleared. Otherwise the cell which was just moved is placed at the front of the undo list. The two tests in step 418 are: (1) the current cut size is less than the previously best cut size and the partition is legally balanced, or (2) the current cut size equals the best cut size seen and the current legal balance is better than the previous legal balance. The idea behind this step is that a move is accepted if the new cut size is an improvement and balance is a legal value, or if the new cut size is equal to the old cut size, the balance is legal, and the partition is now more balanced.

Step 420 is performed after the supply of free cells referred to in step 410 has been exhausted by repeated performance of steps 412–418. Step 420 is the same as step 3 of algorithm 4 in reference (4).

Although the above-described modification of algorithm 4 allows the balance to be temporarily violated, the undo list $\sigma$ is automatically maintained so that any final partition produced is balanced. In other words, if the balance is violated, free cells continue to be moved in an effort to restore balance or, if balance is not achievable in that way, previously moved cells on the undo list are moved back until balance is restored.

It will be understood that the foregoing is merely illustrative of the principles of this invention and that various modifications can be made by those skilled in the art without departing from the scope and spirit of the invention. For example, the foregoing partitioning method enhancements can be used in any combination as desired. If some are not needed, they can be eliminated, and only the others used.

The invention claimed is:

1. A method of fabricating an electrical circuit which includes two subcircuits and at least one circuit node which is not in either of said subcircuits, each of said subcircuits including a plurality of circuit elements, each of said circuit elements requiring predetermined electrical connections to predetermined others of said circuit elements, and at least some of said circuit elements requiring predetermined electrical connections to said node, said method including the step of placing the circuit elements in the circuit so that the circuit elements are divided between the subcircuits, said placing step comprising a preliminary trial phase in which at least some of said circuit elements are moved between said subcircuits in an effort to reduce a variable which indicates the number of said electrical connections which must extend between said subcircuits, said preliminary trail phase of said placing step comprising the steps of:

identifying all circuit elements which require an electrical connection to said node;

after performing said identifying step and each time a circuit element which was identified in said identifying step is a first of the circuit elements identified in said identifying step to move from a subcircuit which previously contained all of said circuit elements identified in said identifying step to the other of said subcircuits, increasing said variable by approximately half the amount that said variable is increased when a circuit element connected only to other circuit elements in one of said subcircuits is moved to the other of said subcircuits; and after performing said identifying step and each time a circuit element which was identified in said identifying step is moved to a subcircuit which previously contained all other circuit elements identified in said identifying step, decreasing said variable by approximately half the amount that said variable is decreased when a circuit element connected only to other elements in said subcircuits is moved to a subcircuit which contains all of the other circuit elements to which that circuit element is connected.

2. A method of fabricating an electrical circuit which includes two subcircuits, each of said subcircuits including a plurality of circuit elements, each of said circuit elements requiring predetermined electrical connections to predetermined others of said circuit elements, said method including the step of placing the circuit elements in the circuit so that the circuit elements are divided between the subcircuits, said placing step comprising a preliminary trial phase in which at least some of said circuit elements are moved between said subcircuits in an effort to reduce a variable which indicates the number of said electrical connections which must extend between said subcircuits, said preliminary trial phase of said placing step comprising the steps of:

initially placing said circuit elements in said subcircuits and designating at least one of said circuit elements as locked in the subcircuit in which that circuit element is initially placed;

after performing the preceding step, moving a circuit element which is not designated as locked from one of said subcircuits to the other in an effort to reduce said variable;

after performing the preceding step, designating as locked the circuit element which was moved during performance of the preceding step; and repeating the two preceding steps as a continuation of said effort to reduce said variable.

3. A method of fabricating an electrical circuit which includes two subcircuits, each of said subcircuits including a plurality of circuit elements, each of said circuit elements requiring predetermined electrical connections to predetermined others of said circuit elements, said method including the step of placing the circuit elements in the circuit so that the circuit elements are divided between the subcircuits, said placing step comprising a preliminary trail phase in which at least some of said circuit elements are moved between said subcircuits in an effort to reduce a variable which indicates the number of said electrical connections which must extend between said subcircuits, said preliminary trial phase of said placing step comprising the steps of:

collectively identifying a subplurality of said circuit elements which are all in one of said subcircuits as a master circuit element;

after performance of the preceding step, treating said master circuit elements as a circuit element during performance of the succeeding steps;

moving a circuit element from one of said subcircuits to the other in an effort to reduce said variable; and repeating the preceding step using different ones of said circuit elements as a continuation of said effort to reduce said variable.

4. The method defined in claim 3 wherein each of said circuit elements has an associated weight value which is used to ensure that the aggregate weights of the circuit elements in each of said subcircuits conform to a predetermined balance requirement, and wherein said step of treating said master circuit element comprises the step of:

computing a weight value for said master circuit element as the sum of the weight values of the circuit elements in said subplurality of circuit elements.

5. The method defined in claim 3 wherein circuit elements which are connected to one another are identified as a net, wherein data is maintained for each net which includes a reference to each circuit element in that net, and wherein said step of treating said master circuit element comprises the step of:

for each net containing one of the circuit elements in said subplurality, replacing said reference to said one of said circuit elements with a reference to said master circuit element.

6. A method of fabricating an electrical circuit which includes two subcircuits, each of said subcircuits including a plurality of circuit elements, each of said circuit elements requiring (1) predetermined electrical connections to predetermined others of said circuit elements, and (2) an associated portion of an overall circuit resource, and wherein said overall circuit resource must be divided between said subcircuits in accordance with a predetermined ratio range, said method including the step of placing the circuit elements in the circuit so that the circuit elements are divided between the subcircuits, said placing step comprising a preliminary trial phase in which at least some of said circuit elements are moved between said subcircuits in an effort to reduce a variable which indicates the number of said electrical connections which must extend between said subcircuits without causing the resulting division of said overall circuit resource between said subcircuits to be outside said predetermined ratio range, said preliminary trail phase of said placing step comprising the steps of:

(a) identifying a circuit element which has not yet been moved from one subcircuit to the other and which can be moved to the other subcircuit without producing a division of said overall circuit resource between said subcircuits which is outside of said ratio range, and if there is no such circuit element, then identifying a circuit element which has not been moved from one subcircuit to the other subcircuit even through moving the identified circuit element will produce a division of said overall circuit resource between said subcircuits which is outside of said ratio range;

(b) after the preceding step, moving the identified circuit element from said one subcircuit to said other subcircuit;

(c) after the preceding step, recomputing said number;

(d) after the preceding step, clearing any list of circuit element moves which may have to be reversed and skipping step (e) if either of the following conditions is satisfied: (i) the value of said number computed in step (c) is less than any previously computed value and the division of said overall circuit resource between said subcircuits is within said predetermined ratio range, or (ii) the value of said number computed in step (c) is approximately equal to the smallest previously computed value of said number and the division of said overall circuit resource between said subcircuits is closer to said predetermined ratio range than said division was for the last accepted move;

(e) after the preceding step, adding to the list of circuit element moves which may have to be reversed the circuit element move performed in step (b);

(f) repeating the preceding steps while step (a) can be performed; and (g) after step (a) can no longer be performed, reversing any circuit element moves in the list of circuit element moves which may have to be reversed.

7. The method defined in claim 6 wherein in each performance of step (a) the circuit element identified is the circuit element which will produce the greatest decrease in said number when that circuit element is moved from said one subcircuit to said other subcircuit.

* * * * *